United States Patent [19]
Thoms et al.

[11] Patent Number: 5,814,826
[45] Date of Patent: Sep. 29, 1998

[54] METHOD AND APPARATUS FOR ALIGNING PHOTOPRINTING PLATES IN A PRODUCTION LINE

[75] Inventors: Roland Thoms, Freiburg; Gunter Kettner, Neubrandenburg; Dietmar Schuldt, Neubrandenburg; Lutz Hamann, Neubrandenburg, all of Germany

[73] Assignee: Demminer Maschinen Technik GmbH, Germany

[21] Appl. No.: 702,963

[22] Filed: Aug. 26, 1996

[51] Int. Cl.⁶ .................................................. G01B 11/00
[52] U.S. Cl. ...................... 250/548; 250/559.3; 356/400
[58] Field of Search ........................... 250/548, 559.3, 250/559.37, 559.29, 206.1, 206.2, 221, 222.1; 356/400, 399, 394, 389, 375, 373

[56] References Cited

U.S. PATENT DOCUMENTS

| | | |
|---|---|---|
| 2,720,146 | 10/1955 | Mears ............................................ 95/73 |
| 2,814,975 | 12/1957 | Mears ............................................ 95/76 |
| 3,199,430 | 8/1965 | Brown ........................................... 95/73 |
| 3,679,316 | 7/1972 | Boujon ....................................... 356/394 |
| 3,974,374 | 8/1976 | Inoue ......................................... 250/548 |
| 4,109,158 | 8/1978 | Blitchington et al. .................... 250/548 |
| 4,698,491 | 10/1987 | Lysen ...................................... 250/559.3 |
| 4,904,087 | 2/1990 | Harvey et al. ............................ 250/548 |
| 5,103,082 | 4/1992 | Fonneland et al. ...................... 356/400 |
| 5,170,058 | 12/1992 | Berasi et al. ............................. 250/548 |

*Primary Examiner*—Edward P. Westin
*Assistant Examiner*—John R. Lee
*Attorney, Agent, or Firm*—Jacobson & Johnson

[57] ABSTRACT

A method and apparatus for precisely aligning two photo printing plates with each other by placing a light emitting laser diode on one side of one of the photoprinting plates and a photo diode that provides coordinate information on the other photoprinting plate so that when the laser beam from the laser emitting diode is directed through the photoprinting plates to the photo diode, the coordinate information on excited point on the photo diode can be compared to a reference signal to generate a control signal to activate motors that position the photoprinting plates in the proper position with respect to each other.

7 Claims, 3 Drawing Sheets

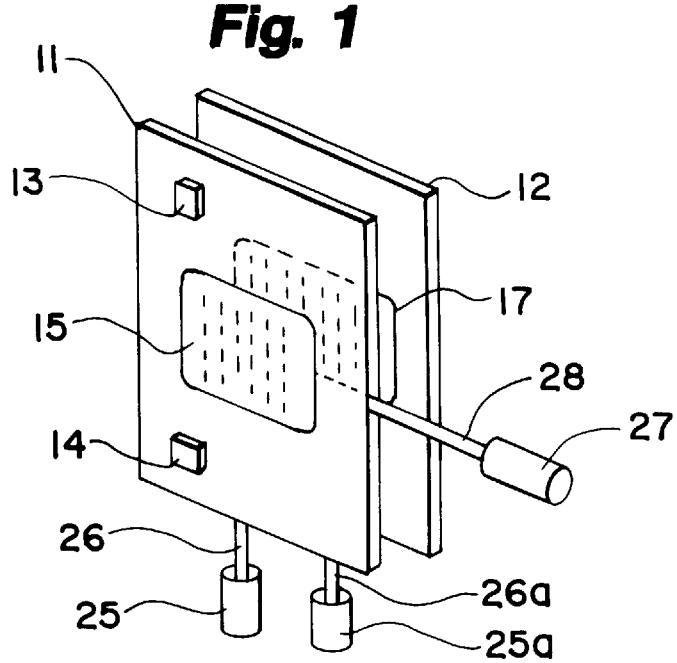
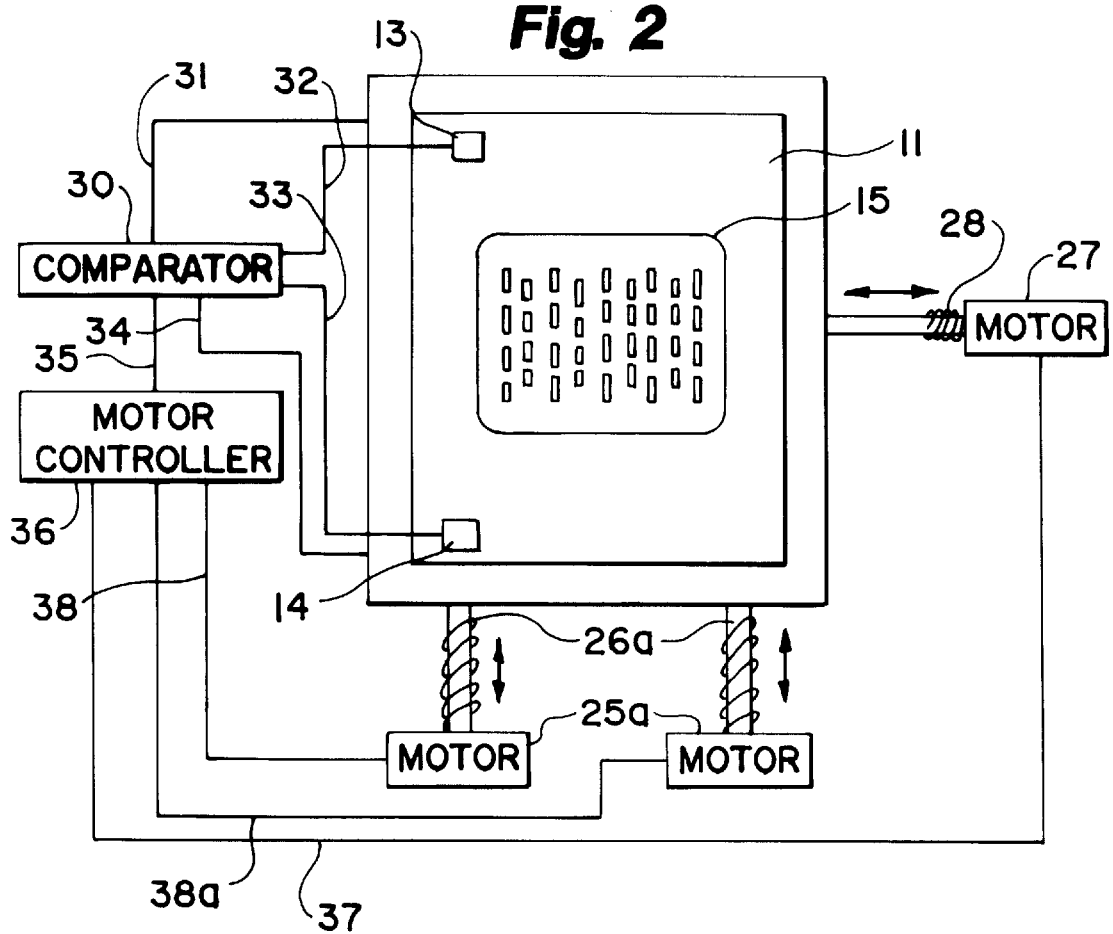

METHOD AND APPARATUS FOR ALIGNING PHOTOPRINTING PLATES IN A PRODUCTION LINE

FIELD OF THE INVENTION

This invention relates generally to photoprinting, and more specifically, to apparatus and a method of alignment of photoprinting plates with use of a laser beam emitter located on one photoprinting plate, and a photo diode located on a second photoprinting plate with the photo diode providing coordinate information of the point of impingement of the laser beam to enable the system to position the two photoprinting plates in registration with each other.

BACKGROUND OF THE INVENTION

The concept of photoprinting plates for use in etching and photoprinting plates for use in etching of aperture masks for use in television tubes and the like is well known in the art. Photoprinting apparatus for use in forming etchant resist patterns on metal webs are shown in Mears pattern U.S. Pat. Nos. 2,720,146 and 2,814,975. The photoprinting plates are positioned on the opposite sides of the light sensitive coatings on the metal web to enable forming the proper patterns in the opposite sides of the light sensitive coating. After exposure the light sensitive coating is developed to leave a pattern of exposed metal areas which are subsequently etched to produce precise apertures through the metal web. In order to precisely etch the openings, one has to be sure that the photoprinting plates are in proper alignment or registration before the light sensitive coating is developed. By registration, it is understood in the art to mean that two photoprinting plates are positioned on opposite sides of the web so that when the subsequent etchant resist patterns are formed, they permit one to etch the metal web from both sides with the etchant cavities from opposite surfaces meeting on the interior of the metal web to form a precise aperture in the metal web.

BRIEF DESCRIPTION OF THE PRIOR ART

U.S. Pat. No. 2,720,146 shows a photoprinting apparatus for printing on to light sensitive coatings located on a metal web.

U.S. Pat. No. 2,814,975 shows a further embodiment of a photoprinting apparatus for bringing two plates into registration with the use of a micrometer screw means.

U.S. Pat. No. 3,199,430 shows a photoprinting apparatus to bring the plates into proper registration with the use of ball and socket joints.

SUMMARY OF THE INVENTION

The present invention comprises a method and apparatus for precisely aligning two photo printing plates with each other by placing a light emitting laser diode on one side of one of the photoprinting plates and a photo diode that provides coordinate information on the other photoprinting plate so that when the laser beam from the laser emitting diode is directed through the photoprinting plates to the photo diode, the information on the coordinates of the impingement of the light beam can be compared to a reference signal to provide a control signal to activate motors that position the photoprinting plates in the proper position with respect to each other.

BRIEF DESCRIPTION OF THE DRAWINGS

FIG. 1 shows a perspective schematic view of two photoprinting plates without frames, positioned in a spaced apparatus position, with each of the photoprinting plates having a pattern for projecting onto opposite sides of a metal web;

FIG. 2 shows a schematic of a front view of the system for positioning a photoprinting plate;

DESCRIPTION OF THE PREFERRED EMBODIMENT

Figure 3:
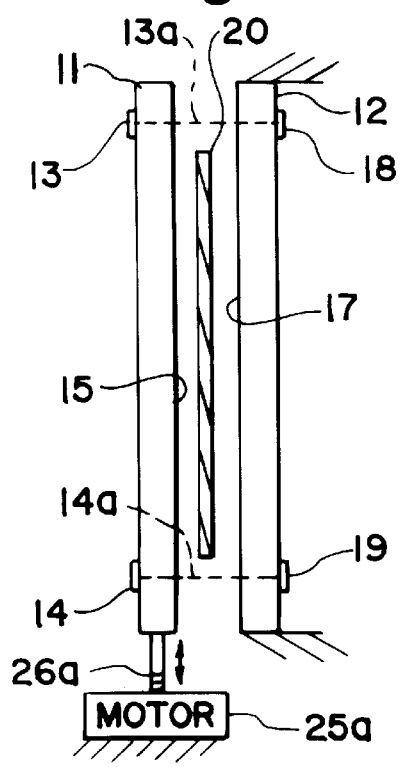
FIG. 3 shows a partial side schematic view of two photoprinting plates positioned on opposite sides of a metal web coated with a light sensitive resist.

FIG. 1 shows a schematic of the photoprinting adjustment system with three motors to position the photoprinting plate 11. FIG. 3 show a first glass photoprinting plate 11 having a first laser emitting diode 13 and a second laser emitting diode 14 secured to the outside of photoprinting plate 11. A first photoprinting pattern 15 for forming the pattern in one side of the metal web is shown on the photoprinting plate 11. The second glass photoprinting plate 12 includes a first photo diode 18 and a second photo diode 19 which are positioned on the outside of photoprinting plate 12 and in general alignment with the laser emitting 13 and 14 diodes on photoprinting plate 11. A second photoprinting pattern 17 is located on photoprinting plate 12. Located between the two photoprinting plates 11 and 12, is a metal web 20 having a light sensitive coating on each side of the metal web 20.

FIG. 3 shows that photoprinting plate 12 is held in fixed position while photoprinting plate 11 is positionable with respect thereto. A first motor 25 has a member 26 that can be extended or retracted to vertically position photoprinting plate 11 and a second motor 25a has a member 26a that can be extended or retracted to vertically position photoprinting plate 11. The combination of motors 25 and 25a can be used to provide rotational adjustment to positioning of plate photoprinting plate 11 by providing unequal displacement. Similarly, FIG. 2 shows a second motor 27 which has a member 28 that can be extended or retracted to horizontally position photoprinting plate 11. While only two motors are shown, the use of two motors and members can be used on each side to provide means to displace the top or bottom portion of the photoprinting plate 11 in unequal proportions.

Figure 3A:
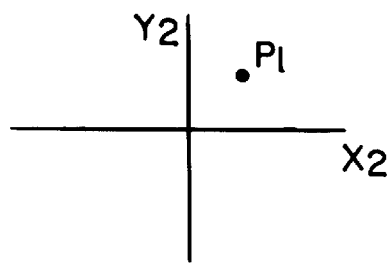
FIG. 3A shows a first position in (x,y) coordinates of a laser beam impinging of photo diode 18.
Figure 4:
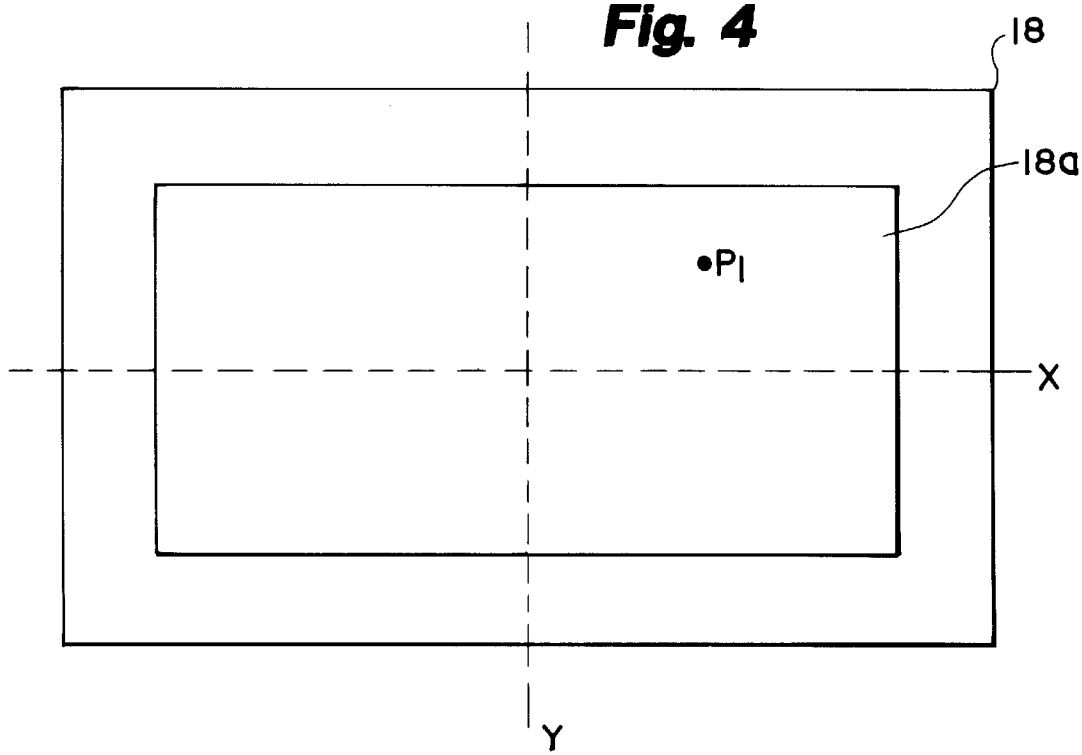
FIG. 4 shows a photo diode having a central region where impingement of a laser beam thereon provides local excitement to provide coordinate information of the location of the impingement of the laser beam.

FIG. 4 shows photo diode 18 having a receiving area 18a with (x,y) coordinates superimposed on the photo diode 18. $P_1$ indicates a point of activation of the photo diode by a laser beam. That is, a laser beam impinging on photo diode 18 excites the photo diode at point $P_1$ which is transferred to (x,y) coordinates as shown in FIG. 3A. Systems for providing coordinate information and position of impingement on a receiver are known in the art. One such system is sold by Hamamatsu Photonics of Hamamatsu City, Japan.

Figure 3B:
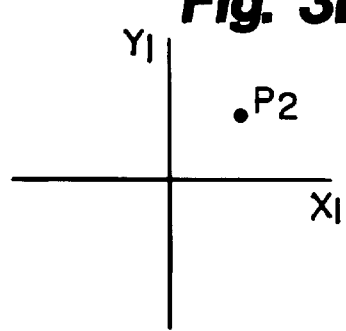
FIG. 3B shows a second position in (x,y) coordinates of a laser beam impinging of photo diode 19.

FIG. 3 illustrates how a first laser beam 13a from light emitting diode 13 passes through the upper portion of glass photoprinting plates 11 and 12 to impinge on photo diode 18 and a second laser beam 14a from light emitting diode 14 passes through the lower portion of glass photoprinting plates 11 and 12 to impinge on photo diode 19. FIG. 3A and FIG. 3B illustrate how the points of activation, $P_1$ and $P_2$, would appear on (x,y) coordinates. That is, the points of activation $P_1$ and $P_2$ are located offset from the center position of the (x,y) axis which in the example shown is the position where the two photoprinting plates 11 and 12 would be in register with each other. Although the (x,y) coordinate (0,0) is used as the reference point, other reference points could be used.

FIG. 3A shows that the first photoprinting plate 11 should be moved downward with respect to photoprinting plate 12 and that photoprinting plate 11 should also be moved to the left with respect to photoprinting plate 12. In addition, the position of point $P_2$ indicates that the photoprinting plate 11 could be rotated slightly to bring the two photoprinting plates 11 and 12 into registration with each other.

FIG. 2 shows a schematic front view illustrating a comparator 30 which can be a computer and software that controls light emitting diode 13 through lead 32 and light emitting diode 14 through lead 33. Similarly, a lead 31 extends from photo diode 18 to comparator 30 and a lead 34 extends from photo diode 19 to comparator 30. Comparator 35 provides a signal to a motor controller 36 for activating motor 25 through lead 38 and motor 27 through lead 37. Motor 25 can either extend or retract member 26 thereby positioning photoprinting plate 11 in a vertical direction and similarly motor 27 can extend or retract member 28 to thereby position photoprinting plate in a horizontal direction.

The present invention provides a system for positioning a set of photoprinting plates 11 and 12 in register with each other using a first photoprinting plate 11 and a laser emitting diode located 13 located on first photoprinting plate 11 with a second photoprinting plate 12 spaced laterally from the first photoprinting plate 11 with the first photoprinting plate 11 postionable with respect to second photoprinting plate 12 through motors 25 and 26 with the control of the motors provided by comparator 30 that determines the position of the first photo printing plate 11 with respect to the second photoprinting plate 12 by comparing the output signal of photo diodes 18 and 19 to reference signal and then sending a control signal to reposition the first photoprinting plate 11 with respect to the second photoprinting plate 12 until the first photoprinting plate 11 and the second photoprinting plate 12 are in proper register with each other.

Figure 5:
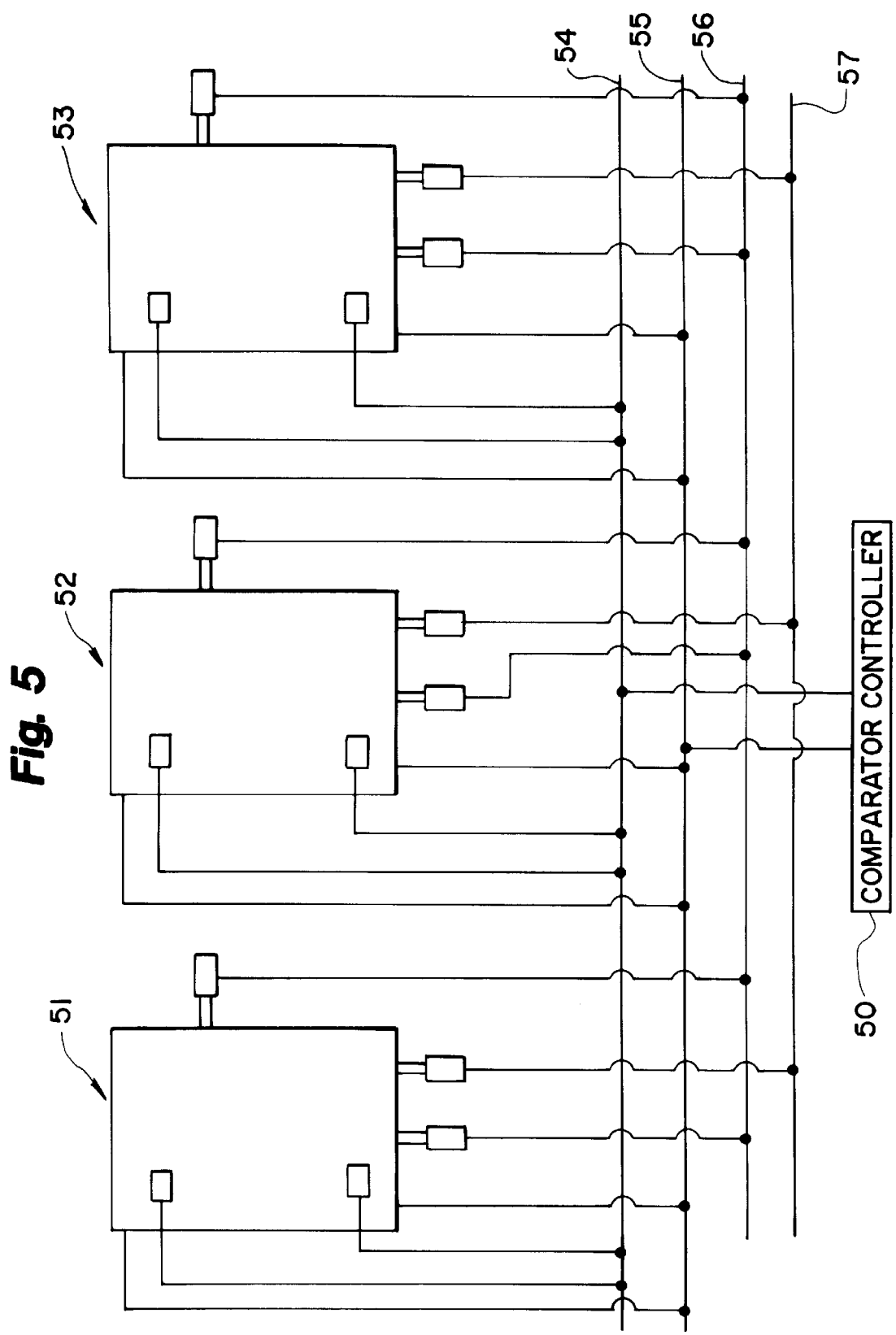
FIG. 5 shows a schematic of system wherein multiple photoprinting stations are controlled by a single comparator.

FIG. 5 shows how multiple systems for controlling multiple photoprinting apparatus 51, 52 and 53. In the system shown in FIG. 5, the signals are sent to bus lines 54, 55 and 56 with the comparator controller 50 directing the appropriate control signal to the proper position motor in each of the photoprinting apparatus.

We claim:

1. A system for positioning a set of photoprinting plates in register with each other comprising:
   a first photoprinting plate;
   a first laser emitting diode located on a first side of said first photoprinting plate;
   a second laser emitting diode located on the first side of said first photoprinting plate and spaced from said first laser emitting diode;
   a metal web having a light sensitive coating located proximate a second side of said first photoprinting plate;
   a second photoprinting plate, said second photoprinting plate having a first side and a second side, said second photoprinting plate spaced laterally from said first photoprinting plate with said first photoprinting plate postionable with respect to said second photoprinting plate, said second photoprinting plate having a first side proximate said metal web;
   a first photo diode located on said second side of said second photoprinting plate, for providing a first output signal as a function of the point of excitement of the first photo diode by said first laser emitting diode;
   a second photo diode located on said second side of said second photoprinting plate, for providing a second output signal as a function of the point of excitement of the second photo diode by said second laser emitting diode;
   a comparator for determining the position of the first photo printing plate with respect to the second photoprinting plate by comparing each of the output signals to a reference signal and then sending a control signal to reposition the first photoprinting plate with respect to the second photoprinting plate until the first photoprinting plate and the second photoprinting plate are in proper register with each other.

2. The system of claim 1 wherein said photoprinting plates are glass and a laser beam emitted by said first laser emitting diode passes through both of said photoprinting plates.

3. The system of claim 1 including a first motor for horizontally positioning the first photoprinting plate with respect to the second photoprinting plate.

4. The system of claim 3 including a second motor and a third motor for vertically and rotationally positioning the first photoprinting plate with respect to the second photoprinting plate.

5. The system of claim 4 including a plurality of sets of photoprinting plates postionable with respect to each other with said plurality of sets of photoprinting plates positionable in response to a further output signal from said comparator.

6. The system of claim 1 wherein the first photoprinting plate includes a first pattern for etching one side of the metal web and the second photoprinting plate includes a second pattern for etching a second side of the metal web to provide precise openings through the metal web when the first and second patterns are in proper registration on the opposite sides of the metal web.

7. A method of aligning a first and second photoprinting plates, each containing a pattern for projecting on to an etchant resist located on opposite sides of a metal web comprising:
   mounting a laser beam emitter on one side of the first photoprinting plate;
   mounting a photo diode on one side of the second photoprinting plate
   directing a laser beam through the first photoprinting plate and the second photoprinting plate;
   receiving the laser beam with the photo diode affixed to the second photoprinting plate; and
   sending a signal from the photo diode to a comparator for determining the position of the first photo printing plate with respect to the second photoprinting plate and then sending a signal to reposition the first photoprinting plate with respect to the second photoprinting plate until the first photoprinting plate and the second photoprinting plate are in alignment with each other.

\* \* \* \* \*